United States Patent [19]
Gilliland et al.

[11] Patent Number: 5,812,582
[45] Date of Patent: Sep. 22, 1998

[54] VERTICAL CAVITY SURFACE EMITTING LASER FEEDBACK SYSTEM AND METHOD

[75] Inventors: Patrick B. Gilliland, Chicago; Andy A. Goryachev, Oak Park, both of Ill.

[73] Assignee: Methode Electronics, Inc., Chicago, Ill.

[21] Appl. No.: 889,277

[22] Filed: Jul. 8, 1997

Related U.S. Application Data

[63] Continuation of Ser. No. 538,548, Oct. 3, 1995, abandoned.

[51] Int. Cl.$^6$ .................................................. H01S 3/19
[52] U.S. Cl. .................................. 372/50; 372/43; 372/96
[58] Field of Search ................................ 372/96, 92, 50, 372/36; 257/84; 250/211 J; 369/44.23, 44.12, 112

[56] References Cited

U.S. PATENT DOCUMENTS

| | | | |
|---|---|---|---|
| 4,692,606 | 9/1987 | Sakai et al. | 250/205 |
| 4,733,398 | 3/1988 | Shibagaki et al. | 372/31 |
| 5,043,775 | 8/1991 | Lee | 372/36 |
| 5,123,023 | 6/1992 | Santarelli et al. | 372/38 |
| 5,124,993 | 6/1992 | Braunlich et al. | 372/31 |
| 5,134,671 | 7/1992 | Koren et al. | 385/14 |
| 5,136,152 | 8/1992 | Lee | 250/211 J |
| 5,136,603 | 8/1992 | Hasnain et al. | 372/50 |
| 5,251,001 | 10/1993 | Dave et al. | 356/73.1 |
| 5,285,466 | 2/1994 | Tabatabaie | 372/50 |
| 5,323,026 | 6/1994 | Paoli | 257/85 |
| 5,361,244 | 11/1994 | Nakamura et al. | 369/44.23 |
| 5,475,701 | 12/1995 | Hibbs-Brenner | 372/50 |
| 5,577,064 | 11/1996 | Swirhun et al. | 372/50 |
| 5,608,695 | 3/1997 | Yamazaki | 369/44.12 |
| 5,629,919 | 5/1997 | Hayashi et al. | 369/112 |

FOREIGN PATENT DOCUMENTS

| | | | |
|---|---|---|---|
| 62-188385 | 8/1987 | Japan | 372/50 |
| 2-151084 | 6/1990 | Japan | 257/84 |
| 4-199890 | 7/1992 | Japan | 372/43 |
| 5-299799 | 11/1993 | Japan | 372/50 |

OTHER PUBLICATIONS

Govind P. Agrawal and Niloy K. Dutta, Semiconductor Lasers, Second Edition, 1993, pp. 472–486 (i.e., Chapter 10, Surface–Emitting Lasers). (No Month available).

Roger Ady, Article in *Lightwave* entitled "Opto–electronic device costs influence integration into local area networks," Apr., 1995, pp. 40–43.

Wada, O. et al., IEEE J. Lightwave Tech. vol. LT–7, 1989, p. 186.(no month available).

*Primary Examiner*—Rodney B. Bovernick
*Assistant Examiner*—Yisun Song
*Attorney, Agent, or Firm*—David L. Newman; Jeffrey H. Canfield

[57] ABSTRACT

An vertical cavity surface emitting laser feedback system is provided which has a vertical cavity surface emitting laser for emitting a specific amount of optical radiation. A portion of the optical radiation is received by a detection means which is used to generate a feedback signal that corresponds to the amount of optical radiation being emitted by the vertical cavity surface emitting laser.

7 Claims, 3 Drawing Sheets

VERTICAL CAVITY SURFACE EMITTING LASER FEEDBACK SYSTEM AND METHOD

This is a continuation of application Ser. No. 08/538,548, filed Oct. 3, 1995 now abandoned.

BACKGROUND OF THE INVENTION

The present invention relates generally to a vertical cavity surface emitting laser, and in particular to a feedback system and method for indicating the amount of optical radiation emanating from the laser.

Semiconductor lasers are well known in the art. Theses devices generally consist of a planar layered semiconductor structure having one or more active layers which are bounded at their ends by cleaved surfaces that act as mirrors for the optical resonator. In one form of this structure the layers on one side of the active layer or layers are doped with impurities so as to have an excess of mobile electrons, while on the other side of the active layer(s) the semiconductor layers are doped with impurities so as to have a deficiency of mobile electrons, therefore creating an excess of positively charged carriers called holes. Layers with excess electrons are said to be n-type, i.e., negative, while layers with excess holes are said to be p-type, i.e., positive. Activation of the laser is achieved by applying an electrical potential between the p-side and the n-side of the layered structure, thereby driving either holes or electrons or both in a direction perpendicular to the planar layers so as to "inject" them into the active layers, where electrons recombine with holes to produce light. Optical feedback provided by the cleaved mirrors allows resonance of some of the emitted light to produce coherent "lasing".

During lasing, the photons being emitted by the diode laser escape through the cleaved surfaces on the ends of the active layers. Thus, one end of a diode laser, commonly known as the front facet, emits the vast majority of the photons. Conversely, the other end of a diode laser, commonly known as the back facet, emits photons which are used to monitor the amount of energy being emitted from the front facet since the amount of photons that escape through the front facet are proportional to the amount of photons which escape through the back facet.

Since light is emitted from the back facet of most semiconductor diode lasers, the packaging of a diode, along with a means for indicating the amount of energy being emitted, is relatively simple. For example, the RLD-85PC diode package by ROHM, Inc. contains both a laser diode for transmitting data and a photodiode for performing power-monitoring by monitoring the amount of energy which escapes through the back facet.

Accordingly, the power-monitoring photodiode within the diode packaging provides a monitor current $I_m$ which varies as the optical power being generated by the laser diode changes. Normally, the changes in the monitor current $I_m$ are directly proportional (i.e., linear) to the changes in the optical power generated by the laser diode. However, the ratio of monitor current $I_m$ with regard to the laser diode's optical power can vary widely from one diode package to the next. Therefore, each diode package must be calibrated separately in order to determine its specific ratio of monitor current $I_m$ to laser diode optical power.

The primary purpose of providing a monitor current $I_m$ is for ensuring that, during operation, the laser diode is within its lasing mode of operation. The minimum current which must be supplied to the laser diode to cause lasing is referred to as the threshold current $I_{th}$.

When the current being supplied to the laser diode is less than the required threshold current $I_{th}$, the laser diode is said to be operating in the LED mode. In the LED mode, the current supplied to the laser diode is only sufficient enough to excite atoms in the laser diode's cavity which cause light to be emitted in a manner similar to that produced by light emitting diodes (LEDs).

When the current being supplied to the laser diode reaches a level which is either greater than or equal to the threshold current $I_{th}$, the laser diode's efficiency of converting electrical current into light will increase dramatically and thus the laser diode changes from the LED mode of operation to the lasing mode of operation.

While various classes of laser diodes will have threshold currents in the same general range, the threshold current $I_{th}$, can still vary considerably between laser diodes. For example, the threshold current of some types of laser diodes can vary by as much as fifty percent between their typical and maximum values.

Furthermore, when the laser diode is operating in the lasing mode, there is a characteristic slope that is used to determine the laser diode's output efficiency η. As commonly known in the art, the output efficiency η is defined as the ratio of the changing in the laser diode's optical output power in relation to the changing in the operating current while in the lasing mode. However, as with the monitor current $I_m$, the actual output efficiency η varies from one laser diode to another.

Based on the variance in the monitor current $I_m$, the threshold current $I_{th}$, and output efficiency η of each laser diode, the operating current range for a given laser diode must be calibrated in order to ensure that the laser diode will always be operating within the lasing mode while transmitting data.

The primary method of ensuring that a laser diode will remain in the lasing mode is to provide the diode with a sufficient bias current. In addition, the laser diode is normally supplied with a second signal which is superimposed onto the bias current and corresponds to the data signals to be transmitted. Thus, the data signals are optically transmitted by the modulation of the laser diode's optical power output which is caused by the superimposing of the data signals onto the bias current. Typically, the bias current and the superimposed data signal are generally referred to as the laser diode's operating current $I_{op}$.

As indicated previously, great care must be taken to ensure that the maximum variation caused by superimposing the data signals onto the bias current will not cause the laser diode's operating current to fall below the required threshold current level $I_{th}$. If the laser diode's operating current falls below the required threshold current level $I_{th}$, then as indicated above, a failure to transmit data will occur because the laser diode will revert to the LED mode of operation.

In addition, besides not going below the threshold current level, the operating current must also be maintained at a sufficiently high enough level that a receiving photodiode can detect the modulated light signal. Furthermore, the laser diode's operating current must not be allowed to go so high as to burn out or significantly reduce the useful life of the laser diode.

Although it is relatively easy to package, within a small device such as a TO-46 can, a diode laser with a photodiode for detecting the energy which escapes from the back facet of the diode, other types of semiconductor lasers do not lend themselves to such compact packaging. For example, those devices known in the art as vertical-cavity surface-emitting lasers (VCSEL) do not provide an efficient and effective means for providing feedback since they lack a back facet.

As known in the art, a VCSEL is a laser emitting device which has its optical cavity positioned normal to the surface of the wafer and, accordingly, the laser output is normal to the surface of the wafer. Ordinarily, VCSELs are manufactured using a substrate with multiple semiconductor layers being grown thereon. The resonant cavity is usually formed by alternating one-quarter (¼) wavelength layers on one end, forming a highly reflective mirror, and coating the opposite end with a reflective metal. As a result of the manufacturing process, VCSELs only provide one optical output on their surface and provide no other optical outputs since an opaque substrate occupies the opposite side of the wafer. Thus, since VCSELs have only one optical output, they do not lend themselves to providing an optical feedback. Correspondingly, there is a need for a compact system which provides an indication of the optical energy being emitted by a VCSEL.

In view of the above, it is an object of the present invention to provide a feedback system which indicates the amount of light energy (i.e., optical radiation) being emitted by a VCSEL.

It is another object of the present invention to provide a feedback system for a VCSEL within a compact area such as a standard, TO-46, can package.

It is still another object of the present invention to provide a cost effective means for providing a feedback signal which indicates the amount of optical radiation being emitted by a VCSEL.

Furthermore, other objects, features, and advantages of the present invention will be apparent from the following detailed description taken in connection with the accompanying drawing.

SUMMARY OF THE INVENTION

In one form of the invention, a feedback system is provided which has a vertical cavity surface emitting laser for emitting a specific amount of optical radiation. A portion of the optical radiation is received by a detection means which generates a feedback signal that corresponds to the amount of optical radiation being emitted by the laser.

The detection means may consist of a PIN diode. Furthermore, a glass window may be provided for receiving the optical radiation and reflecting a portion of the optical radiation onto the detection means. Conversely, in another embodiment, a cavity may be located within the vertical cavity surface emitting laser for allowing a portion of the optical radiation to emanate therefrom.

In a further embodiment, a metal mask may be attached to the detection means. In addition, control circuitry may also be integrated with the detecting means.

In another embodiment of the present invention, a method is provided of indicating the amount of optical radiation being emitted from a vertical cavity surface emitting laser. The method consists of: (1) receiving the optical radiation being emitted from the vertical cavity surface emitting laser; (2) reflecting a portion of the optical radiation onto a detection means; and (3) converting the portion of the optical radiation into a feedback signal which corresponds to the amount of optical radiation being emitted from the vertical cavity surface emitting laser.

Various means for practicing the invention and other advantages and novel features thereof will be apparent from the following detailed description of an illustrative preferred embodiment of the invention.

BRIEF DESCRIPTION OF THE DRAWINGS

There is shown in the drawings the presently preferred embodiments of the present invention, wherein like numerals in the various figures pertain to like elements, and wherein.

DETAILED DESCRIPTION OF THE PRESENTLY PREFERRED EMBODIMENTS

Figure 1:
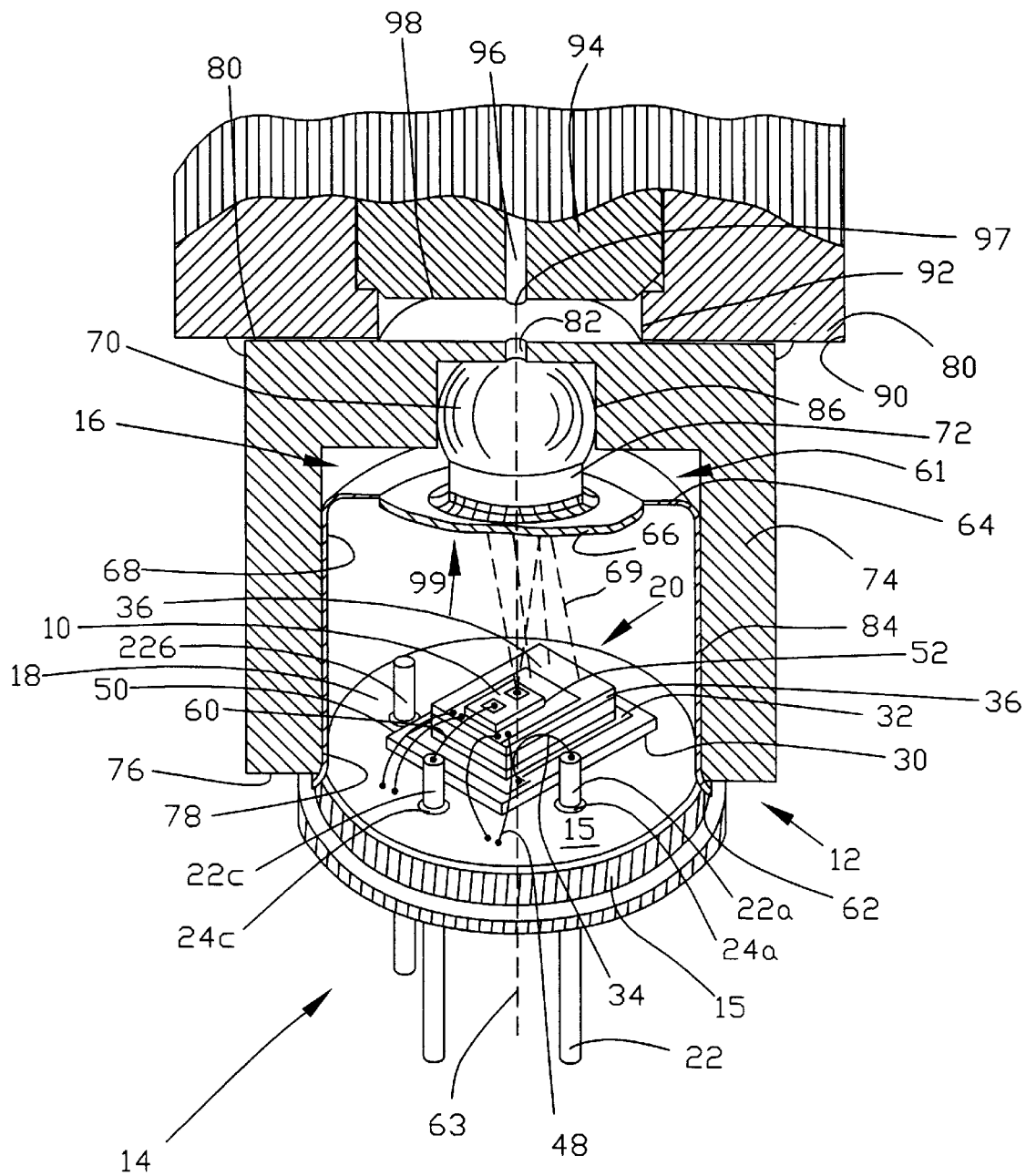
FIG. 1 is an enlarged cross-sectional perspective side view of a VCSEL mounted within a standard can package and employing a feedback system in accordance with the present invention.

The present invention relates to a feedback system and method for a VCSEL which indicates the amount of optical radiation being emitted from the laser. Referring to FIG. 1, an embodiment of the present invention is depicted wherein a Vertical Cavity Surface Emitting Laser (VCSEL) 10 is shown being mounted within a standard can package 12 such as, for example, a TO-46. The can package 12 is of standard construction for the containment of a laser emitting device. Accordingly, the can package 12 consists of a header assembly 14 and a cover assembly 16.

Referring to the header assembly 14, the base 15 of the header is generally disk shaped and is made of a metallic material. The base 15 provides a mounting surface 18 for the electronic devices 20 within the can 12.

Figure 2:
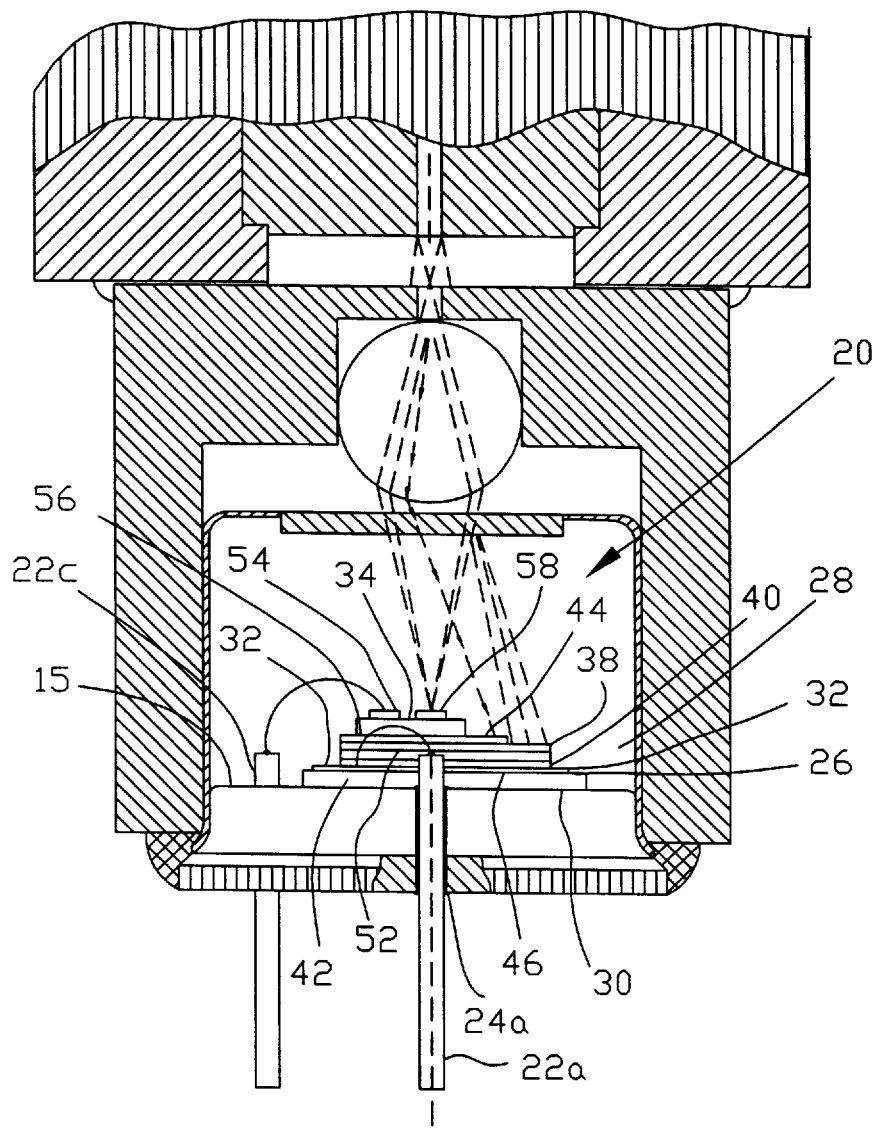
FIG. 2 is a perspective view of the VCSEL and PIN diode which are mounted within the can package depicted in FIG. 1.

Extending through the base 15 of the header 14 are a plurality of electrical pins 22. The electrical pins 22 allow for an external electrical connection to be formed with the electronic devices 20 mounted within the can 12. Each electrical pin 22 extends through the header base 15, via a corresponding passage (passages not shown). As shown in FIG. 2, electrical pin 22b is soldered to the base 15 of the header 14 and, conversely, electrical pins 22a and 22c are electrically isolated from the base 15 by a corresponding glass seal 24. For example, glass seal 24c surrounds pin 22c within the passageway where the pin extends through the base 15.

As indicated above, attached to the header base 15 are various electrical components 20. Referring to FIG. 2, a perspective view of the header assembly 14 is depicted with the various electrical components 20 mounted thereon. As stated previously, the header base 15 is made of a metallic material. Correspondingly, a flat ceramic substrate 26 electrically isolates the components 20 from the header base 15. In the preferred embodiment, the substrate 26 is rectangular in shape with a top surface 28 and an opposite bottom surface 30. The bottom surface 30 is attached to the header base 15 by any conventional means such as conductive epoxy or solder.

Referring to FIGS. 1 and 2, mounted to the top surface 28 of the ceramic substrate 26 is a flat conductive layer 32. In the preferred embodiment, the conductive layer 32 is a thin film which covers most of the top surface 28 of the ceramic substrate 26. The conductive layer 32 can consist of, for example, gold deposited over nickel. Furthermore, the conductive layer 32 can be applied to the ceramic substrate 26 by any conventional means such as vacuum deposition or plating.

Connected to the conductive layer 32 and electrical pin 22a is a wire bond 34. The wire bond 34 forms an electrical connection from the conductive layer 32 to electrical pin 24a. The bond wire 34 can be made of gold, for example, and bonded to both the conductive layer 32 and electrical pin 24a by using any standard wirebonding procedure.

Attached to the conductive layer 32 is a PIN diode 36 which results in the conductive layer 32 being sandwiched between the ceramic substrate 26 and the PIN diode. In the preferred embodiment, the PIN diode 36 serves as a means for detecting the amount of optical radiation being emitted by the VCSEL 10. However, it should be understood that other various means for detecting the amount of optical radiation being emitted by the VCSEL 10 can be used such as, for example, any photodiode or method of optical energy detection.

As commonly known in the art, the PIN diode 36 consists of an n-substrate 40 and a p-type epitaxial growth 38 over an intrinsic, or i-layer epitaxial growth, 42 situated therebetween. Since PIN diodes 36 are well known in the art, no further explanation is provided of its construction and operational characteristics.

In accordance with the present invention, the n-substrate 40 of the PIN diode is attached to the conductive layer 32. The n-substrate 40 is attached to the conductive layer 32 in such a manner as to allow an electrical connection to be formed between the n-substrate and the conductive layer. Accordingly, the n-substrate 40 of the PIN diode 36 is attached to the conductive layer 32 by any conventional means such as, for example, solder or conductive epoxy.

Likewise, applied to the p-layer 38 of the PIN diode 36 is a flat metal mask 44. Correspondingly, the PIN diode 36 is sandwiched between the conductive layer 32 and the metal mask 44. The metal mask 44 covers approximately half of the top surface 46 of the PIN diode 36. The metal mask 44 is metalized to the p-layer 38 of the PIN diode 36 and can consist of any opaque conductive material such as, for example, gold plated over nickel. As a result of the metal mask 44 being applied to the p-layer 38 of the PIN diode 36, an electrical connection is formed between the mask and the PIN diode.

Also mounted to the metal mask 44 are a plurality of wires 48. The wires 48 form an electrical connection from the metal mask 44 to the header 15. Furthermore, as stated previously, the header 15 is connected to electrical pin 22b, via a solder connection 50.

Also mounted to the metal mask 44 is the VCSEL 10. As a result, the metal mask 44 is sandwiched between the VCSEL 10 and the PIN diode 36. As stated previously, VCSELs are well known in the art. Commonly, a VCSEL has two electrodes 52,54 with the first electrode 52 (not shown) being located on the bottom of the VCSEL 10 facing metal mask layer 44 and the second electrode 54 being located on the top 56 of the VCSEL. Accordingly, the VCSEL will emit a specific amount of optical radiation from an area 58 in its top 56 whenever a voltage potential is connected across the first electrode 52 and the second electrode 54. Since the structure of VCSELs are well know in the art, no further explanation is provided regarding the construction and operational characteristics of the VCSEL.

Still referring to FIGS. 1 and 2, in accordance with the present invention the bottom surface 52 of the VCSEL 10 is attached to the metal mask 44 so that its optical radiation is emitted perpendicularly and away from the surface of the metal mask 44. In addition, the bottom surface 52 of the VCSEL 10 is mounted to the metal mask 44 in such a manner as to allow an electrical connection to be formed between the first electrode 52 of the VCSEL and the metal mask. Therefore, the bottom surface 52 (i.e., first electrode) of the VCSEL is conductively attached to the metal mask 44 by any convention means such as, for example, solder or conductive epoxy.

Attached to the second electrode 54 of the VCSEL 10 is a wire bond 60. The wire bond 60 forms an electrical connection from the second electrode 54 of the VCSEL 10 to electrical pin 22c. Like the other wires described above, wire 22c is connected from the VCSEL 10 to electrical pin 22c by any standard procedure. In addition, it may be desirable to have more than one wire extend from the VCSEL 10 to electrical pin 22c in order to reduce the effects of electromagnetic interference on the operation of the VCSEL. Furthermore, it may be advantageous to position the second electrode 54 of the VCSEL 10 as close as possible to electrical pin 22c in order to further reduce the effects of electromagnetic interference.

As indicated previously and shown in FIG. 1, attached to the base 15 of the header assembly 14 is the cover assembly 16. The cover assembly 16 consists of a cap 61 which is generally tubular in shape with an open end 62 and a closed end 64. Positioned in the center of the closed end 64 is a glass window 66. The glass window 66 is generally circular in shape.

Plugging the open end 62 of the cap 61 is the header base 15. The cap 61 is secured to the header base 15 by conventional means, such as by welding, and forms a gas tight cavity 68 within the can 12. Injected within the cavity 68 is an inert gas for preventing corrosion of the electrical devices 20 within the cavity.

The cover assembly glass window 66 allows the optical radiation produced by the VCSEL 10 to radiate outside of the can 12. As shown in FIG. 1, the center of the window 66, header base 15, and active area 58 on the VCSEL 10 are positioned on the same axis 63 (i.e., centerline).

Mounted over the cover assembly glass window 66 is a ball lens 70. In a preferred embodiment, a gap 72 of approximately 0.012 inches is provided between the glass window 66 and the lens 70. The gap 72 between the window 66 and the ball lens 70 is filled with a composition such as an epoxy or gel. Furthermore, the ball lens 70 is positioned over the glass window 66 in such a manner that the center of the lens lies on the centerline 63.

The can 12, and the ball lens 70, is mounted within a source holder 74. The source holder 74 is generally tubular in shape with a first end 76, having a first opening 78, and a second end 80 which has a corresponding second opening 82. The space within the source holder which receives the can 12 and the ball lens 70 can be divided into a first cavity 84 and a second cavity 86. The first cavity 84 is in communication with both the second cavity 86 and the first opening 78 of the source holder 74. Likewise, the second cavity 86 is in communication with both the first cavity 84 and the second opening 82 of the source holder 74.

The can 12 is mounted within the first cavity 84 by conventional means such as using an epoxy and/or cement (not shown). Accordingly, when the can 12 is securely mounted within the first cavity, the ball lens 70 occupies the second cavity 86.

Attached to the second end 80 of the source holder 74 is an alignment housing 88. The alignment housing 88 is generally tubular in construction with a first end 90 and a second end (second end not shown). The alignment housing 88 is affixed to the source holder by conventional means such as, for example, solder or epoxy. Positioned around the inside of the alignment housing first end 90 is a stop ring 92.

Correspondingly, a ferrule 94 can be inserted within the second end of the alignment housing 88. The ferrule 94 is slid into the alignment housing until it comes to rest against the stop ring 92. Consequently, the ferrule 94 is of common construction and thus it is cylindrical in shape with an optical fiber 96 extending along its center. The end 97 of the optical fiber 96 is flush with the bottom 98 of the ferrule 94 so that the optical fiber can receive optical radiation for transmission. Therefore, the end 97 of the optical fiber lies on the centerline 63.

Turning to the operation of the above described structure, the electrical pins 22b and 22c are used to transfer a voltage potential, from a source located outside of the can 12, to the VCSEL 10 which is mounted within the can. Typically, pin 22b will be at ground potential. Thus, when connected to pins 22b and 22c, a voltage potential will be placed across the first electrode 52 and the second electrode 54 of the VCSEL 10. Accordingly, the voltage across the electrodes 52,54 of the VCSEL will cause a specific amount of optical radiation to be emitted from the active area 58 on the top 56 of the VCSEL 10.

The optical radiation emanating from the VCSEL 10 as shown in FIG. 1 will generally travel in the direction of arrow 99. The majority of the optical energy will flow through both the glass window 66 and the epoxy in gap 72, and into the ball lens 70. The ball lens 70 will focus the optical energy towards the end 97 of the optical fiber 96. Thus, the optical energy will travel through the opening 82 of the source holder 74 and enter the optical fiber 96.

Although the majority of the optical energy emanating from the VCSEL 10 will pass through the glass window 66, a portion of the optical radiation received by the glass window will be reflected towards the base 15 of the header assembly 14 as shown, for example, by light waves 69, and onto the PIN diode 36 which provides a detection means. Normally, approximately 4 percent of the optical radiation being emitted by the VCSEL 10 will be reflected by the glass window 66. In a further embodiment, a higher percentage of optical radiation (i.e., 10 to 15 percent) can be reflected towards the base 15 of the header assembly 14 by coating the window 66 with a reflective material such as, for example, INCONEL (Inco Alloys International, Huntington, W. Va.).

Consequently, the portion of the optical radiation being reflected towards the base 15 of the header assembly 14 and onto the PIN diode 36 will directly correspond with the amount of optical radiation being generated by the VCSEL 10. Furthermore, the reflected optical radiation will strike, inter alia, the metal mask 44 and the area of the PIN diode p-layer 38 which is not covered by the metal mask. The intensity of the portion of the optical radiation which strikes the PIN diode p-layer 38 will cause a corresponding current (i.e., feedback signal) to be generated between 22b and 22a. Thus, the feedback signal which is generated between pins 22b and 22a will vary proportionally to the amount of optical radiation being emitted by the VCSEL 10 since the amount of the optical radiation striking the PIN diode p-layer 38 will be converted, and thus directly correspond, with the amount of the optical radiation being emitted by the VCSEL.

Thus, the above provides a feedback system for indicating the amount of optical radiation being emitted by the laser 10 with the current between pins 22b and 22a corresponding to the amount of optical energy being generated by the VCSEL.

Since it is desirable for the optical fiber 96 to receive the maximum percentage of optical radiation being emitted by the VCSEL 10, it is preferred that the center of the end 97 of the optical fiber 96, the ball lens 70, the window 66, and the active area 58 on the VCSEL 10 be positioned along the same centerline 63. Correspondingly, it is preferred that the active area 58 on the VCSEL 10 be mounted over the center of the header assembly base 15. Likewise, it is preferred that the cover assembly 16 be mounted onto the header assembly 14 in such a manner that the center of the glass window 66 lies directly over the active area 58 of the VCSEL 10. In addition, it is preferred that the ball lens 70 be secured within cavity 86 so that its center lies along the centerline 63.

Furthermore, as commonly known in the art, the can 12 and ball lens 70 can be positioned, via a standard alignment process, so that the maximum amount of optical energy is focused onto the end 97 of the optical fiber 96. Normally, the alignment process consists of inserting the can 12 and ball lens 70 within the source holder 74 and positioning a ferrule 94 within the alignment housing 88. Alignment is then provided by moving the source holder 74 into the position, relative to the alignment housing 88, which corresponds to the optical fiber 96 receiving the greatest amount of optical energy. Once the optimal position of the source holder 74 is determined, the source holder 74 is secured to the alignment housing 88 by epoxy or solder.

Once the source holder 74 is secured relative to the alignment housing 88, the feedback characteristics of the PIN diode 36, in relation to the amount of optical radiation being coupled from the VCSEL 10 into the fiber 96, can be determined. Accordingly, a voltage potential can be placed across the VCSEL so that the desired amount of optical radiation is received by the optical fiber 96. Thus, the corresponding voltage potential provided across pins 22a and 24b can be measured in order to determine the feedback signal that will correspond to the desired amount of optical radiation to be emitted by the VCSEL 10.

As indicated by FIG. 1, error may be introduced into the feedback system due to optical radiation being reflected by the bottom 98 of the ferrule 94 towards the base 15 of the header assembly 14. The exact amount of optical radiation which is reflected by the bottom of the ferrule 94 cannot be precisely determined since the present invention is to work with various types of ferrules which may have different reflection characteristics. However, as shown in FIG. 1, most of the unwanted optical radiation feedback provided by the ferrule 94 will be focused by the ball lens 70 onto the VCSEL 10. Furthermore, the opaque metal mask 44 on the PIN diode 36 will also prevent most of the unwanted optical radiation feedback from striking the PIN diode since the portion of the PIN diode which surrounds the VCSEL 10 is covered by the metal mask 44. Thus, only a negligible amount of unwanted optical radiation feedback will strike the PIN diode 36 when compared to the amount of optical energy which is reflected onto the PIN diode by the glass window 66.

Figure 3:
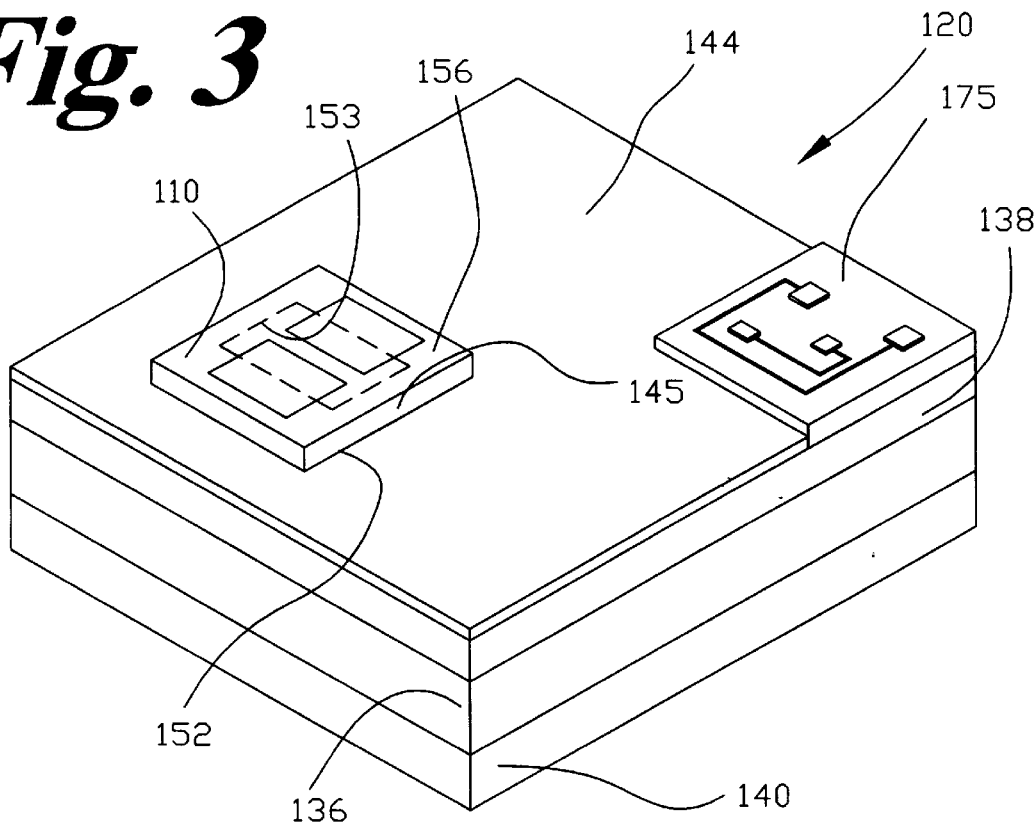
FIG. 3 is an enlarged perspective view of another embodiment of a feedback system in accordance with the present invention.

In another embodiment of the present invention, the unwanted optical radiation feedback can be eliminated by providing a direct coupling between the VCSEL 10 and the PIN diode 36. Turning to FIG. 3, an enlarged perspective view of another embodiment of the present invention, which employs direct coupling, is depicted. In FIG. 3, the electrical devices 120 may serve as replacements to the VCSEL 10, metal mask 44, and the PIN diode 36 depicted in FIGS. 1–2.

Accordingly, the n-substrate 140 of the PIN diode 136 is connected to the conductive layer 32 of FIGS. 1–2; both the bottom 152 of the VCSEL and the p-layer 138 of the PIN diode 136 are connected to the metal mask 144 which is electrically coupled to pin 22b of FIGS. 1–2; and the top 156 of the VCSEL 110 is electrically connected to pin 22c of FIGS. 1–2.

Since direct coupling is provided in FIG. 3, the entire surface of the PIN diode p-substrate 138 is covered by the metal mask 144 except for a rectangular opening 145 which is covered by the VCSEL 110. The VCSEL 110 covers the entire opening 145 in the metal mask 144 and is connected to the mask in such a manner as to provide an electrical connection between the mask and the bottom 152 of the VCSEL.

Figure 4:
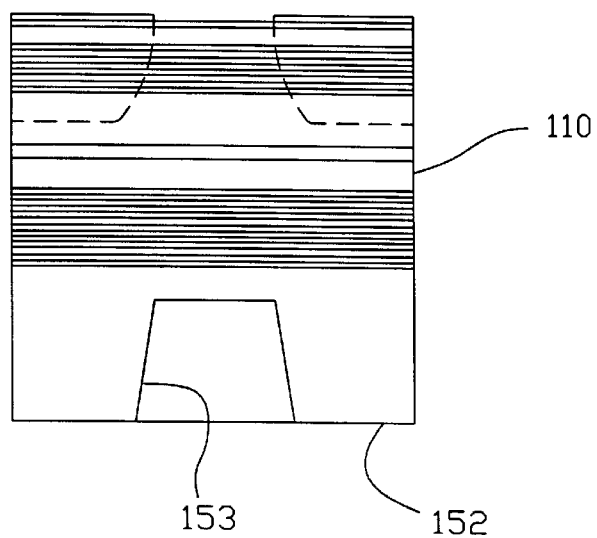
FIG. 4 is a further enlarged cross-sectional side view of the VCSEL which is used in the feedback system depicted in FIG. 3.

Referring to FIG. 4, a further enlarged cross-sectional side view of the VCSEL which is used in the feedback system depicted in FIG. 3 is depicted. The portion of the VCSEL 110 which is mounted directly over the opening in the metal mask is etched so as to form a cavity 153. The cavity 153 in the bottom 152 of the VCSEL 110 can be formed by any conventional means such as by using chemical or mechanical etching. The cavity 153 is etched within the bottom 152 of the VCSEL 110 so as to provide a means for a portion of the optical radiation to escape from the bottom of the VCSEL. In a preferred embodiment, approximately one percent (1%) of the optical radiation generated by the VCSEL 110 will escape from the bottom 152.

Turning back to FIG. 3, with the etched portion 153 of the VCSEL 110 being located over the opening 145 in the opaque metal mask 144, a means is provided for emitting, directly to the PIN diode 136, a portion of the optical radiation which is directly proportional to the amount of optical radiation emanating from the top 156 of the VCSEL 110. Correspondingly, like the embodiment depicted in FIGS. 1–2, the embodiment of FIG. 3 will provide a current (i.e., feedback signal) between pins 22a and 22b which directly relates to the amount of optical radiation emanating from the top 156 of the VCSEL 110.

Also, in another embodiment, electrical circuitry 175 can be located on the top surface 144 of the PIN diode 136 in FIG. 3 or the top surface 44 of FIGS. 1 and 2. The electrical circuitry 75,175 can be used, for example, as a means for providing various functions such as maintaining a constant laser power output by regulating the bias current supplied to the VCSEL. As shown in FIGS. 1 and 2, the metal mask 44 only partially covers PIN diode 36. The surface area of the metal mask 44 may be varied in order to accommodate the growth and definition of integrated circuits with the PIN diode structure. By integrating electrical circuity directly with the PIN diode 36, a compact laser diode and optical feedback assembly is provided.

It should be understood that in describing the top and bottom portions of devices in the above embodiments, the terms "top" and "bottom" are used by way of example only due to the orientation of the drawings. It should also be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. A feedback system for monitoring the optical radiation emitted from a vertical cavity surface emitting laser, the system comprising:

an optics housing forming an internal optics cavity and having a partially reflective window disposed at a first end of the optics cavity and a header base for mounting optical components thereon and enclosing a second end of the optics cavity;

a PIN photodiode mounted on the header having upper and lower surfaces;

a metallic mask formed over a portion of the upper surface of the PIN photodiode, leaving a portion of the upper surface exposed;

a vertical cavity surface emitting laser mounted on the mask, the mask separating the vertical cavity surface emitting laser and the PIN photodiode, and masking a portion of the upper surface of the PIN photodiode beyond an area covered by the vertical cavity surface emitting laser, the vertical cavity surface emitting laser being configured to radiate optical radiation toward the partially reflective window in the first end of the optics housing;

the partially reflective window reflecting a portion of the radiation back against the exposed portion of the upper surface of the PIN photodiode, the reflected radiation generating a feedback current within the PIN photodiode proportional to the amount of radiation emitted from the vertical cavity surface emitting laser.

2. The feedback system of claim 1 wherein the partially reflective window is coated with a reflective material.

3. The feedback system of claim 2 wherein the reflective material is INCONEL.

4. The feedback system of claim 1 wherein the optics housing further comprises:

a focusing element; and means for receiving an end of an optical fiber;

the focusing element configured to focus a majority of the optical radiation emitted from the vertical cavity surface emitting laser onto the end of the optical fiber.

5. The feedback system of claim 4 wherein the focusing element comprises a ball lens.

6. The feedback system of claim 5 where the ball lens and the end of the optical fiber define an optical axis, and the vertical cavity surface emitting laser is aligned with the optical axis.

7. The feedback system of claim 6 wherein the partially reflective window is substantially perpendicular to the optical axis.

* * * * *